(12) United States Patent
Lee

(10) Patent No.: US 6,760,883 B2
(45) Date of Patent: Jul. 6, 2004

(54) GENERATING LOG-LIKELIHOOD VALUES IN A MAXIMUM A POSTERIORI PROCESSOR

(75) Inventor: Inkyu Lee, Kearny, NJ (US)

(73) Assignee: Agere Systems Inc., Allentown, PA (US)

( * ) Notice: Subject to any disclaimer, the term of this patent is extended or adjusted under 35 U.S.C. 154(b) by 434 days.

(21) Appl. No.: 09/951,660

(22) Filed: Sep. 13, 2001

(65) Prior Publication Data

US 2003/0074628 A1 Apr. 17, 2003

(51) Int. Cl.$^7$ ............................................. H03M 13/03

(52) U.S. Cl. ..................... 714/794; 714/792; 714/781

(58) Field of Search ................................ 714/794, 792, 714/781, 758, 807, 48, 52, 10; 375/341, 262, 265

(56) References Cited

U.S. PATENT DOCUMENTS

| | | | |
|---|---|---|---|
| 5,933,462 A | * 8/1999 | Viterbi et al. | 375/341 |
| 6,145,114 A | * 11/2000 | Crozier et al. | 714/794 |
| 6,226,773 B1 | * 5/2001 | Sadjadpour | 714/794 |
| 6,400,290 B1 | * 6/2002 | Langhammer et al. | 341/94 |
| 6,510,536 B1 | * 1/2003 | Crozier et al. | 714/755 |

* cited by examiner

Primary Examiner—Phung M. Chung

(57) ABSTRACT

A maximum a posteriori (MAP) detector/decoder employs an algorithm that computes log-likelihood value with an a posteriori probability (APP) value employing a number N of previous state sequences greater than or equal to two (N≧2). By defining the APP with more previous state sequences, the set of α values may be calculated for a current state and then reduced. After generating the reduced set of α values, the full set of β values may be generated for calculation of log-likelihood values. By calculating a set of α values that may be decimated by, for example, N, the amount of memory required to store the α values used in subsequent computations is reduced.

17 Claims, 2 Drawing Sheets

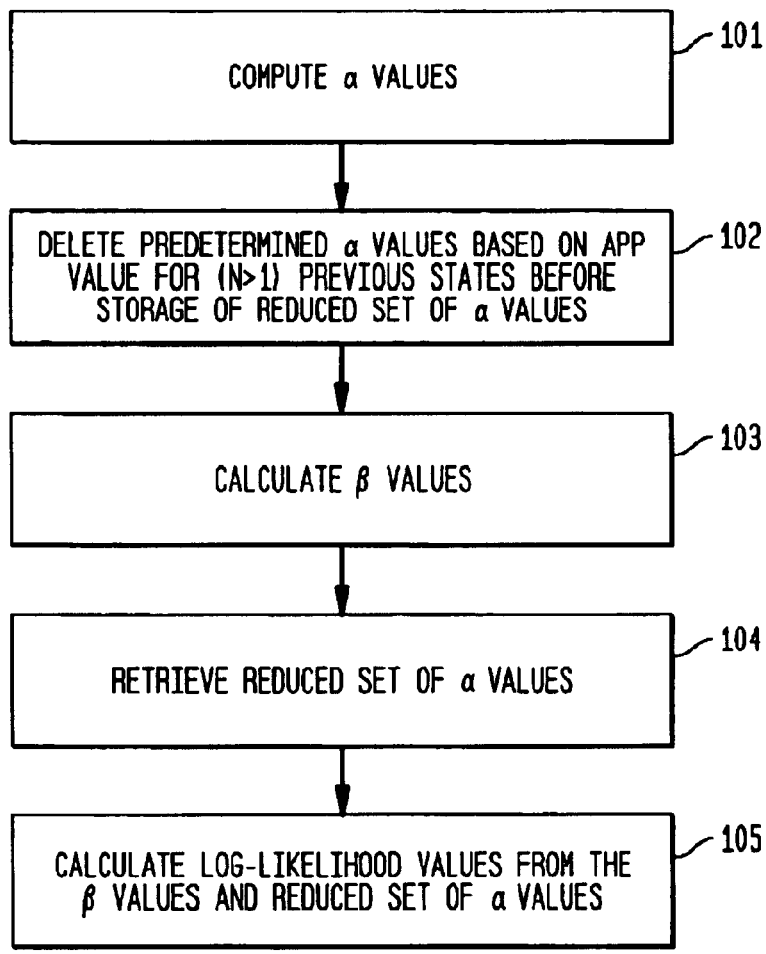
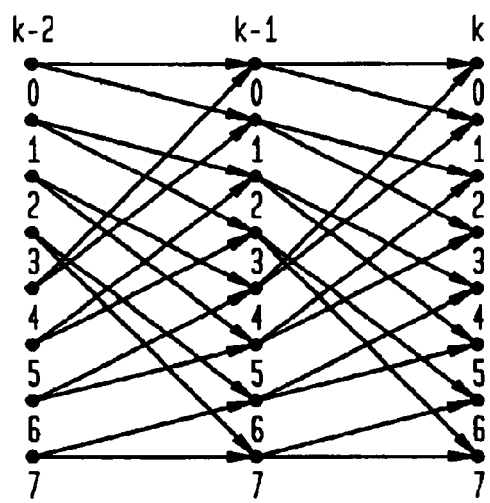

GENERATING LOG-LIKELIHOOD VALUES IN A MAXIMUM A POSTERIORI PROCESSOR

BACKGROUND OF THE INVENTION

1. Field of the Invention

The present invention relates to generating, storing, and updating log-likelihood values when processing encoded data with a maximum a posteriori (MAP) algorithm.

2. Description of the Related Art

MAP decoding algorithms are employed for processing data input to a processor for detection and/or decoding operations. The algorithm provides a maximum a posteriori estimate of a state sequence of a finite-state, discrete-time Markov process observed in noise. The MAP algorithm forms a trellis corresponding to possible states (portion of received symbol bits in the sequence) for each received output channel symbol per unit increment in time (i.e., clock cycle).

States, and transitions between states, of the Markov process spanning an interval of time may be represented by a trellis diagram. The number of bits that a state represents is equivalent to the memory of the Markov process. Thus, probabilities (sometimes of the form of log-likelihood values) are associated with each transition within the trellis, and probabilities are also associated with each decision for a symbol bit in the sequence.

The processor using the MAP algorithm computes log-likelihood values using $\alpha$ (forward state probabilities for states in the trellis) and $\beta$ values (reverse state probabilities in the trellis), as described subsequently. The $\alpha$ values (a vector) are associated with states within the trellis, and these $\alpha$ values are stored in memory. The processor using the MAP algorithm then computes values of $\beta$, and the $\alpha$ values are then retrieved from memory to compute the final output log-likelihood values. To compute the log-likelihood values, the entire state metric array of $\alpha$ values is stored by the MAP algorithm.

The variable $S_k$ is defined as the state of the Markov process at time k, and $y_k$ is defined as the noisy channel output sample at time k, $y_m^n$ is defined as the sequence $y_m^n = (y_m, y_{m+1}, \ldots y_n)$ and, for a data block of length K, probability functions may be defined for the Markov process as given in equations (1) through (3):

$$\alpha_s^k = p(S_k = s; y_1^k) \quad (1)$$

$$\beta_s^k = p(y_{k+1}^K | S_k = s) \quad (2)$$

$$\gamma_{s',s} = p(S_k = s; y_k | S_{k-1} = s'). \quad (3)$$

where s is the sequence defining the state $S_k$ of the Markov process at time k.

In prior art decoders, calculation of the probability associated with a decision generally employs knowledge of a previous state $S_{k-1}$ sequence s' at time k−1 (complete state decisions and associated probabilities) of the decoder and the current state at time k. Thus, the algorithm computes the a posteriori probability (APP) value $\sigma^k(s',s) = p(S_{k-1} = s'; S_k = s | y_1^K)$ using the probabilities defined in equations (1) through (3). The APP value is then as given in equation (4):

$$\sigma^k(s',s) = \alpha_{s'}^{k-1} \gamma_{s',s}^k \beta_s^k \quad (4)$$

With the APP value for input $u_k$, the log-likelihood value may then be calculated as given in equation (5):

$$L(u_k) = \log\left(\frac{p(u_k = +1 | y_1^K)}{p(u_k = -1 | y_1^K)}\right). \quad (5)$$

SUMMARY OF THE INVENTION

In accordance with embodiments of the present invention, a maximum a posteriori (MAP) processor employs an algorithm that computes log-likelihood value with an a posteriori probability (APP) value employing a number N of previous state sequences greater than or equal to two (N≧2). The set of $\alpha$ values may be calculated for a current state and then reduced in accordance with an APP value based on previous state sequences. After forming the reduced set of $\alpha$ values, the full set of $\beta$ values may be subsequently generated for calculation of log-likelihood values. By calculating a set of $\alpha$ values that may be decimated by, for example, N, the amount of memory required for to store the $\alpha$ values used in subsequent computations is reduced.

In accordance with an exemplary embodiment of the present invention, log-likelihood values are generated for data in a processor by a) generating a set of $\alpha$ values for a current state; and b) deleting selected values of the set of $\alpha$ values based on an a posteriori probability (APP) value having at least two previous states (N≧2) to provide a reduced set of $\alpha$ values corresponding to the data. The exemplary embodiment of the present invention further c) generates a set of $\beta$ values for the current state; and d) calculates the log-likelihood values from the reduced set of $\alpha$ values and the set of $\beta$ values.

BRIEF DESCRIPTION OF THE DRAWINGS

Other aspects, features, and advantages of the present invention will become more fully apparent from the following detailed description, the appended claims, and the accompanying drawings in which:

FIG. 1 shows an exemplary method for generating log-likelihood values in accordance with the present invention;

FIG. 2 shows an 8-state trellis used to illustrate generation of log-likelihood values in accordance with the exemplary method of FIG. 1;

DETAILED DESCRIPTION

Figure 3:
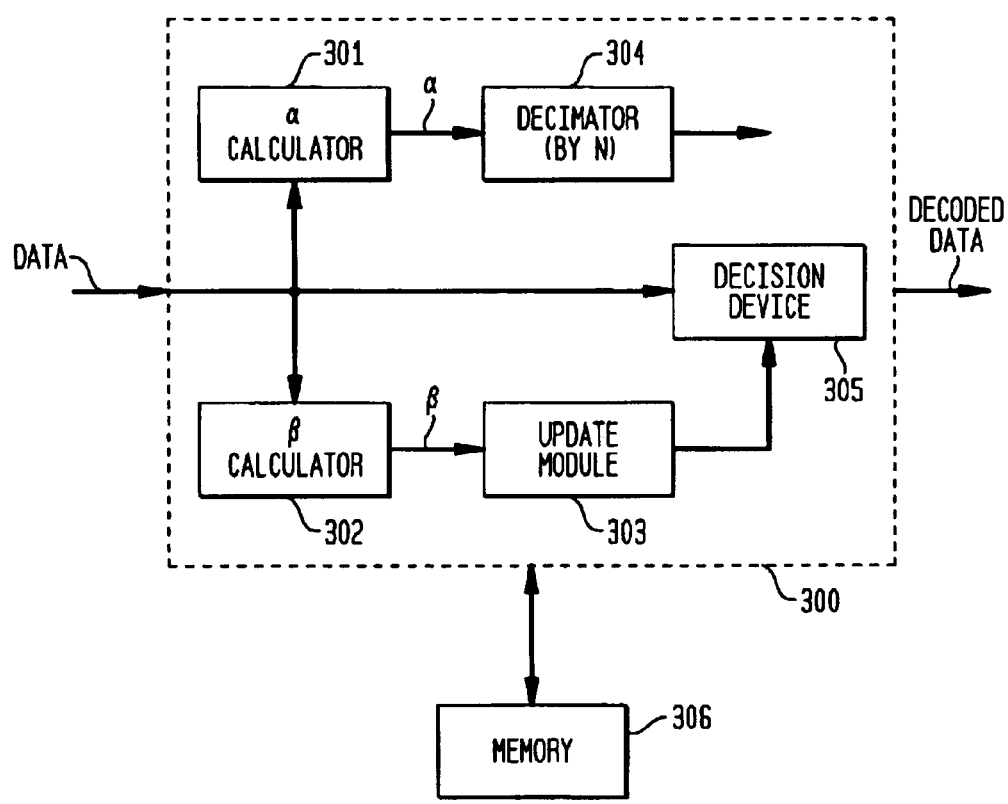
FIG. 3 shows a processor that may employ the exemplary method shown in FIG. 1.

In accordance with embodiments of the present invention, a maximum a posteriori (MAP) processor employs an algorithm that a computes log-likelihood value with an a posteriori probability (APP) value spanning a number N of previous states greater than or equal to two (N≧2). By defining the APP spanning greater than two time intervals, the set of $\alpha$ values may be calculated and then reduced. After the reduced set of $\alpha$ values is calculated, the full set of $\beta$ values may be generated for calculation of log-likelihood values. By calculating a set of $\alpha$ values that may be decimated by a factor of N, the amount of memory required to store the $\alpha$ values used in subsequent computations is reduced. While the present invention is described for a MAP algorithm generated for turbo codes using the current and two previous states, one skilled in the art may readily extend the teachings herein to maximum a posteriori algorithms derived for other types of codes and for a greater number of previous states.

A MAP decoding algorithm computes the a posteriori probability (APP) value for a Markov process state variable $S_k$, a sequence $y_m^n$ defined as the sequence $y_m^n=(y_m, y_{m+1}, \ldots, y_n)$, and data block of length K using the probabilities defined in equations (1) through (3). With the APP value, the log-likelihood value for input $u_k$ may be defined as given in equation (5). Equations (1)–(3) and (5) are repeated below for convenience:

$$\alpha_s^k = p(S_k=s; y_1^k) \tag{1}$$

$$\beta_s^k = p(y_{k+1}^K | S_k=s) \tag{2}$$

$$\gamma_{s',s} = p(S_k=s; y_k | S_{k-1}=s') \tag{3}$$

$$L(u_k) = \log\left(\frac{p(u_k = +1 \mid y_1^K)}{p(u_k = -1 \mid y_1^K)}\right) \tag{5}$$

In accordance with an exemplary embodiment of the present invention, a MAP decoding algorithm calculates an a posteriori probability (APP) value $\sigma^k$ based on a current state s at time k as well as the two previous state sequences s' and s" at time k–1 and k–2, respectively. The MAP decoding algorithm calculates the APP value $\sigma^k(s'',s',s)$ as the probability $p(S_{k-2}=s''; S_{k-1}=s'; S_k=s; y_1^K)$. Using the chain rule, it is straightforward to show the following relationship for the APP value $\alpha^k(s'',s',s)$ as given in equation (6):

$$\sigma^k(s'', s', s) = \tag{6}$$
$$p(S_{k-2} = s''; y_1^{k-2}) \cdot \frac{p(S_{k-2} = s''; S_{k-1} = s'; y_1^{k-1})}{p(S_{k-2} = s''; y_1^{k-2})} \cdot$$
$$\frac{p(S_{k-2} = s''; S_{k-1} = s'; S_k = s; y_1^k)}{p(S_{k-2} = s''; S_{k-1} = s'; y_1^{k-1})} \cdot$$
$$\frac{p(S_{k-2} = s''; S_{k-1} = s'; S_k = s; y_1^K)}{p(S_{k-2} = s''; S_{k-1} = s'; S_k = s; y_1^k)} =$$
$$p(S_{k-2} = s''; y_1^{k-2}) \cdot p(S_{k-1} = s'; y_{k-1} | S_{k-2} = s''; y_1^{k-2}) \cdot$$
$$p(S_k = s; y_k | S_{k-2} = s''; S_{k-1} = s'; y_1^{k-1}) \cdot$$
$$p(y_{k+1}^K | S_{k-2} = s''; S_{k-1} = s'; S_k = s; y_1^k).$$

A property of the Markov process is, if the current state $S_k$ is known, events after time k do not depend on $y_1^k$. Using this Markov process property, equation (6) may be expressed as given in equation (7):

$$\sigma^k(s'',s',s) = p(S_{k-2}=s''; y_1^{k-2}) \cdot p(S_{k-1}=s'; y_{k-1}=s'' | S_{k-2}=s'') \cdot p(S_k=s; y_k | S_{k-1}=s') \cdot p(y_{k+1}^K | S_k=s) \tag{7}$$

Using the definitions of probabilities given in equations (1) through (3), equation (7) may then be expressed as given in equation (8):

$$\sigma^k(s'',s',s) = \alpha_{s''}^{k-2} \gamma_{s'',s'}^{k-1} \gamma_{s',s}^k \beta_s^k \tag{8}$$

From equation (8), the log-likelihood value as given in equation (5) may then be calculated with the relationship of equation (9):

$$p(u_{k-1} = +1; y_1^K) = \sum_{(s'',s',s) \in S_+^{k-1}} p(S_{k-2}; S_{k-1}; S_k; y_1^K) \tag{9}$$

$$p(u_{k-1} = -1; y_1^K) = \sum_{(s'',s',s) \in S_-^{k-1}} p(S_{k-2}; S_{k-1}; S_k; y_1^K)$$

where $(s'',s',s) \in S_+^{k-1}$ ("$\in$" defined as "an element of") is the set of state sequences which contain transition segments from $S_{k-2}=s''$ to $S_{k-1}=s'$ generated by the input $u_{k-1}=+1$, and $(s'',s',s) \in S_-^{k-1}$ is the set of state sequences which contain transition segments from $S_{k-2}=s''$ to $S_{k-1}=s'$ generated by the input $u_{k-1}=-1$.

Then, from equation (5), the log-likelihood values L for the input $u_{k-1}$ and $u_k$ may be computed as in equations (10) and (11), respectively:

$$L(u_{k-1}) = \log\left(\frac{\sum_{S_+^{k-1}} \alpha_{s''}^{k-2} \gamma_{s'',s'}^{k-1} \gamma_{s',s}^k \beta_s^k}{\sum_{S_-^{k-1}} \alpha_{s''}^{k-2} \gamma_{s'',s'}^{k-1} \gamma_{s',s}^k \beta_s^k}\right) \tag{10}$$

$$L(u_k) = \log\left(\frac{\sum_{S_+^k} \alpha_{s''}^{k-2} \gamma_{s'',s'}^{k-1} \gamma_{s',s}^k \beta_s^k}{\sum_{S_-^k} \alpha_{s''}^{k-2} \gamma_{s'',s'}^{k-1} \gamma_{s',s}^k \beta_s^k}\right). \tag{11}$$

MAP algorithms of the prior art employ $\alpha_{s''}^{k-2}$ and $\alpha_{s'}^{k-1}$ to compute $L(u_{k-1})$ and $L(u_k)$, respectively. However, a MAP algorithm in accordance with an exemplary embodiment of the present invention employing the relationships of equations (10) and (11) for N=2 computes both the log-likelihood values $L(u_{k-1})$ and $L(u_k)$ with only $\alpha_{s''}^{k-2}$. Thus, when storing values for $\alpha$, only every other value needs to be stored since each value may be used to compute two different log-likelihood values.

FIG. 1 shows an exemplary method for generating log-likelihood values in accordance with the present invention. At step 101, a set of $\alpha$ values are computed for the trellis with an APP value based on N≧2 time intervals, such as in accordance with the expression of equation (8) for N=2. At step 102, certain values are deleted (e.g., decimation of the set of $\alpha$ values by N), and, thus, these values are not necessarily stored in memory. While the particular $\alpha$ values that are deleted may be specified by a given design choice, preferred embodiments keeps values of $\alpha$ at regular positions within the set (e.g. every second value for N=2, every third value for N=3, etc.).

In step 103, $\beta$ values are calculated, for example, as is done in accordance with methods of the prior art. In step 104, the reduced set of $\alpha$ values stored in memory is retrieved from memory. In step 105, the final output value for the log-likelihood value is calculated from the values of $\beta$ and the reduced set of $\alpha$ values. In step 105, an algorithm, as described with respect to equations (10) and (11), is applied that allows for calculation of the final output value with the reduced set of $\alpha$ values.

As an example, FIG. 2 shows an 8-state trellis (states 0–7) from time k–2 to time k. The number next to the state in the trellis identifies the state's number. The total branch metric $\Gamma_2^k$ from state 2 at time k–2 to state 0 at time k is $\gamma_{2,4}^{k-1} \gamma_{4,0}^k$. Note that for the $2^M$ state trellis (M a positive integer), the path between time k–N to time k is uniquely defined for N≦M. For N>M, there exist multiple paths between two states.

By extending the above equations (6) and (8) for N previous states, The APP value may be generalized as in equation (12):

$$p(S_{k-N}=s^{(N)}; S_{k-N+1}=s^{(N-1)}; \ldots; S_{k-1}=s'; S_k=s; y_1^K) = \alpha_{s^{(N)}}^{k-N} \Gamma_N^k \beta_s^k \tag{12}$$

where the total branch metric $\Gamma_N^k$ is defined as $\Gamma_N^k = \gamma_{s^{(N)},s^{(N-1)}} \ldots$ Also, it follows that the log-likelihood values are computed as in equation (13)

$$L(u_{k-i}) = \log\left(\frac{\sum_{S_+^{k-i}} \alpha_{s(N)}^{k-N} \Gamma_N^k \beta_s^k}{\sum_{S_-^{k-i}} \alpha_{s(N)}^{k-N} \Gamma_N^k \beta_s^k}\right) \text{ for } i = 0, 1, \ldots N-1. \tag{13}$$

Thus, this example shows that storing the $\alpha$ values for $\alpha_{s'}^{k-1}, \alpha_{s''}^{k-2}, \ldots, \alpha_{s^{(N-1)}}^{k-N+1}$ is not necessary when computing the log-likelihood value $L(u_{k-i})$ for i=0,1, ..., N–1. Not storing these values reduces the memory size by N.

FIG. 3 shows a MAP processor 300 that may employ the exemplary method shown in FIG. 1. MAP processor 300 includes α calculator 301, β calculator 302, update module 303, decimator 304, and decision device 305. MAP processor 300 is coupled to memory 306. MAP processor 300 receives input data for detection or decoding, and α calculator 301 determines α values (forward trellis state probabilities). Once calculated, decimator 304 selects a subset of α values in accordance with an exemplary embodiment of the present invention for storage in memory 306. β calculator 302 determines β values (reverse trellis state probabilities). Update module 303 retrieves the subset of α values, β values, and previously stored branch metric values from memory 306. Using the retrieved values, Update module 303 calculates log-likelihood values, such as by the method given in equation (13). Decision device 305 makes decisions corresponding to a sequence of the input data based on the log-likelihood values. Update module 303 then updates and stores the branch metric values in memory 306 using the log-likelihood values.

The following pseudo-code may be employed for an exemplary implementation of a MAP algorithm calculating log-likelihood values in accordance with the present invention

| | |
|---|---|
| 100 | initialize $\alpha_s^0$ and $\beta_s^L$ for s = 0, 1, ... M – 1 |
| 101 | For k = 1, 2, . . . L |
| 102 | compute $\alpha_s^k$ for s = 0, 1, ... , M – 1 |
| 103 | if k = mod$_N$(k) = 0, then |
| 104 | store $\alpha_s^k$ |
| 105 | For k = L, L – 1, . . . , 2 |
| 106 | compute $\beta_s^{k-1}$ for s = 0, 1, ... , M – 1 |
| 107 | set $U_k^+ = U_k^- = U_{k-1}^+ = U_{k-1}^- = ... = U_{k-N+1}^- = 0$ |
| 108 | For all possible s1 and s2: |
| 110 | compute C = $\alpha_{s1}^{k-N}\Gamma_N^k\beta_{s2}^k$ where $\Gamma_N^k$ is the total branch metric |
| 111 | between s1 and s2 |
| 112 | For i = 0, 1, . . . , N – 1 |
| 113 | if the path between s1 and s2 contains a transition caused by $u_{k-1} = +1$ |
| 111 | $U_{k-i}^+ = U_{k-i}^+ + C$ |
| 112 | if the path between s1 and s2 contains a transition caused by $u_{k-1} = -1$ |
| 113 | $U_{k-i}^- = U_{k-i}^- + C$ |
| 114 | compute $L(u_{k-i}) = \log\left(\frac{U_{k-i}^+}{U_{k-i}^-}\right)$ |

While the exemplary embodiments of the present invention have been described with respect to methods implemented within a detector, as would be apparent to one skilled in the art, various functions may be implemented in the digital domain as processing steps in a software program, by digital logic, or in combination of both software and hardware. Such software may be employed in, for example, a digital signal processor, micro-controller or general-purpose computer. Such hardware and software may be embodied within circuits implemented in an integrated circuit.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method of generating probabilities to calculate log-likelihood values corresponding to data in a maximum a posteriori processor, the method comprising the steps of:
   (a) generating a set of α values as forward probabilities of a trellis for a current state; and
   (b) deleting selected values of the set of α values based on an a posteriori probability (APP) value having at least two previous states to provide a reduced set of α values corresponding to the data.

2. The invention as recited in claim 1, wherein step (b) further includes the step of storing the reduced set of α values in a memory.

3. The invention as recited in claim 2, wherein, for step (a), the APP value has two previous states.

4. The invention as recited in claim 1, further comprising the steps of:
   (c) generating a set of β values as reverse probabilities of the trellis for the current state; and
   (d) calculating the log-likelihood values from the reduced set of α values and the set of β values based on the APP value.

5. The invention as recited in claim 4, wherein step (d) further includes the step of retrieving the reduced set of α values from the memory.

6. The invention as recited in claim 4, wherein, for step (a), the APP value for input $u_k$ at time k for a Markov process state variable $S_k$, a sequence $y_m^{n=}(y_m, y_{m+1}, \ldots y_n)$, N previous states, and data block of length K is defined as:

$$p(S_{k-N}=s^{(N)}; S_{k-N+1}=s^{(N-1)}; \ldots ; S_{k-1}=s'; S_k=s; y_1^K) = \alpha_{s^{(N)}}^{k-N}\Gamma_N^k\beta_s^k,$$

where the total branch metric $\Gamma_N^k$ is defined as $\Gamma_N^k = \gamma_{s^{(N)},s^{(N-1)}}^{k-N+1}\gamma_{s^{(N-1)},s^{(N-2)}}^{k-N+2} \ldots \gamma_{s',s}^k$, and:

$\alpha_s^k = p(S_k=s; y_1^k)$, $\beta_s^k = p(y_{k+1}^K|S_k=s)$, and $\gamma_{s',s} = p(S_k=s; y_k|S_{k-1}=s')$.

7. The invention as recited in claim 6, wherein, for step (d), the log-likelihood value $L(u_k)$ for input $u_k$ is:

$$L(u_k) = \log\left(\frac{\sum_{S_+^k} \alpha_{s''}^{k-2} \gamma_{s'',s'}^{k-1} \gamma_{s',s}^k \beta_s^k}{\sum_{S_-^k} \alpha_{s''}^{k-2} \gamma_{s'',s'}^{k-1} \gamma_{s',s}^k \beta_s^k}\right).$$

8. The invention as recited in claim 6, wherein, for step (a), the APP value has N=2 previous states.

9. The invention as recited in claim 1, wherein, for step (a), the APP value for input $u_k$ at time k for a Markov process state variable $S_k$, a sequence $y_m^n=(y_m,y_{m+1},\ldots y_n)$, N previous states, and data block of length K is defined as:

$$p(S_{k-N}=s^{(N)};S_{k-N+1}=s^{(N-1)};\ldots;S_{k-1}=s';S_k=s;y_1^K)=\alpha_{s^{(N)}}^{k-N}\Gamma_N^k\beta_s^k,$$

where the total branch metric $\Gamma_N^k$ is defined as $\Gamma_N^k = \gamma_{s^{(N)},s^{(N-1)}}^{k-N+1}\gamma_{s^{(N-1)},s^{(N-2)}}^{k-N+2}\ldots\gamma_{s',s}^k$, and $\alpha_s^k=p(S_k=s;y_1^k)$, $\beta_s^k=p(y_{k+1}^K|S_k=s)$, and $\gamma_{s',s}=p(S_k=s;y_k|S_{k-1}=s')$.

10. The invention as recited in claim 1, wherein the method is employed during a step of either maximum a posteriori (MAP) detection or MAP decoding of received samples.

11. The invention as recited in claim 1, wherein the method is implemented by a processor in an integrated circuit.

12. Apparatus generating probabilities to calculate log-likelihood values corresponding to data in a maximum a posteriori processor, the method comprising the steps of:

a first calculator that generates a set of α values as forward probabilities of a trellis for a current state; and a decimator that deletes selected values of the set of α values based on an a posteriori probability (APP) value having at least two previous states to provide a reduced set of α values corresponding to the data.

13. The invention as recited in claim 12, further comprising:

a second calculator that generates a set of β values as reverse probabilities of the trellis for the current state; and an update module that calculates the log-likelihood values from the reduced set of α values and the set of β values based on the APP value.

14. The invention as recited in claim 12, further comprising a decision device applying a maximum a posteriori algorithm to generate decisions for the data in the MAP processor.

15. The invention as recited in claim 12, wherein the apparatus is a circuit embodied in an integrated circuit.

16. A computer-readable medium having stored thereon a plurality of instructions, the plurality of instructions including instructions which, when executed by a processor, cause the processor to implement a method for generating log-likelihood values for data in a detector, the method comprising the steps of:

(a) generating a set of α values as forward probabilities of a trellis for a current state; and (b) deleting selected values of the set of α values based on an a posteriori probability (APP) value having at least two previous states to provide a reduced set of α values corresponding to the data.

17. The invention as recited in claim 16, further comprising the steps of:

(c) generating a set of β values for the current state; and (d) calculating the log-likelihood values from the reduced set of α values and the set of set of β values based on the APP value.

* * * * *

UNITED STATES PATENT AND TRADEMARK OFFICE
CERTIFICATE OF CORRECTION

PATENT NO. : 6,760,883 B2
DATED : July 6, 2004
INVENTOR(S) : Inkyu Lee

It is certified that error appears in the above-identified patent and that said Letters Patent is hereby corrected as shown below:

Column 6,
Line 58, replace the equation " $y_m^{nm(y}m, \gamma_{m+1}, ... y_n)$ " with -- $y_m^n = (y_m, y_{m+1}, ... y_n)$ --.

Line 60, replace the equation " $p(S_{k-N} = s^{(N)}; S_{k-N+1} = s^{(N-1)}; ...; S_{k-1} = s'; S_k = s; y_1^k) = \alpha_s(N)^{k-N} \Gamma_N^k \beta_s^k$ ,"

with -- $p(S_{k-N} = s^{(N)}; S_{k-N+1} = s^{(N-1)}; ...; S_{k-1} = s'; S_k = s; y_1^K) = \alpha_{s(N)}^{k-N} \Gamma_N^k \beta_s^k$ ,--.

Line 62, replace the equation " $\Gamma_N^k = \gamma_s(N),_s(N-1)^{k-N+1} \gamma_s(N-1),_s(N-2)^{k-N+2} \cdots \gamma_{s',s}^k$ ,"

with -- $\Gamma_N^k = \gamma_{s(N),s(N-1)}^{k-N+1} \gamma_{s(N-1),s(N-2)}^{k-N+2} \cdots \gamma_{s',s}^k$ ,--.

Column 7,
Line 15, replace the equation " $p(S_{k-N} = s^{(N)}; S_{k-N+1} = s^{(N-1)}; ...; S_{k-1} = s'; S_k = s; y_1^K) = \alpha_2(N)^{k-N} \Gamma_N^k \beta_s^k$ ,"

with -- $p(S_{k-N} = s^{(N)}; S_{k-N+1} = s^{(N-1)}; ...; S_{k-1} = s'; S_k = s; y_1^K) = \alpha_{s(N)}^{k-N} \Gamma_N^k \beta_s^k$ --.

Line 18, replace the equation " $\Gamma_N^k = \gamma_s(N),_s(N-1)^{k-N+2} \cdots \gamma_{s',s}^k$ ,"

with -- $\Gamma_N^k = \gamma_{s(N),s(N-1)}^{k-N+1} \gamma_{s(N-1),s(N-2)}^{k-N+2} \cdots \gamma_{s',s}^k$ --.

Signed and Sealed this

Seventeenth Day of August, 2004

JON W. DUDAS
*Acting Director of the United States Patent and Trademark Office*